(12) United States Patent  (10) Patent No.: US 9,105,677 B2
Dunn et al.  (45) Date of Patent: Aug. 11, 2015

(54) BASE PROFILE OF SELF-ALIGNED BIPOLAR TRANSISTORS FOR POWER AMPLIFIER APPLICATIONS

(71) Applicant: International Business Machines Corporation, Armonk, NV (US)

(72) Inventors: James S. Dunn, Jericho, VT (US); Qizhi Liu, Lexington, MA (US); James S. Nakos, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 14/059,531

(22) Filed: Oct. 22, 2013

(65) Prior Publication Data

US 2015/0108548 A1  Apr. 23, 2015

(51) Int. Cl.
*H01L 29/732* (2006.01)
*H01L 29/737* (2006.01)
*H01L 29/66* (2006.01)
*H01L 29/06* (2006.01)

(52) U.S. Cl.
CPC .......... *H01L 29/737* (2013.01); *H01L 29/0649* (2013.01); *H01L 29/66242* (2013.01); *H01L 29/732* (2013.01); *H01L 29/7371* (2013.01)

(58) Field of Classification Search
CPC .................................................. H01L 29/7375
See application file for complete search history.

(56) References Cited

U.S. PATENT DOCUMENTS

| | | | |
|---|---|---|---|
| 5,340,753 A | 8/1994 | Bassous et al. | |
| 6,235,567 B1 | 5/2001 | Huang | |
| 6,281,097 B1 | 8/2001 | Aoyama | |
| 6,509,587 B2 | 1/2003 | Sugiyama et al. | |
| 6,579,773 B2 | 6/2003 | Norstrom et al. | |
| 6,600,178 B1 * | 7/2003 | Washio et al. | 257/197 |
| 6,673,688 B1 | 1/2004 | U'Ren et al. | |

(Continued)

FOREIGN PATENT DOCUMENTS

| | | |
|---|---|---|
| EP | 1 351 284 | 10/2003 |
| EP | 1 406 308 | 4/2004 |

(Continued)

OTHER PUBLICATIONS

Po Lun Cheng et al., "Effectiveness of Si Seed for Selective SiGe Epitaxial Deposition in Recessed Source and Drain for Locally Strained pMOS Application", The Electrochemical Society Application Meet. Abstr. 2006 MA2006-02 (31): 1423 Short Presentations—Oct. 30, 2006 p. 1.

*Primary Examiner* — Stephen W Smoot
(74) *Attorney, Agent, or Firm* — Gibb & Riley, LLC

(57) ABSTRACT

According to a bipolar transistor structure having a transistor top and a transistor bottom herein, a silicon substrate located at the transistor bottom has a collector region of a first conductivity type. An epitaxial base layer of a second conductivity type overlies, relative to the transistor top and bottom, a portion of the collector region. The epitaxial base layer has a bottom surface on the silicon substrate and a top surface opposite the bottom surface. A top region, relative to the transistor top and bottom, of the epitaxial base layer comprises a concentration of germanium having atomic compositions sufficient to avoid impacting transistor parameters, and sufficient to be resistant to selective chemical etching. A silicon emitter layer of the first conductivity type overlies, relative to the transistor top and bottom, a portion of the epitaxial base layer adjacent to the top surface of the epitaxial base layer.

20 Claims, 15 Drawing Sheets

(56) References Cited

U.S. PATENT DOCUMENTS

| | | |
|---|---|---|
| 6,762,106 B2 | 7/2004 | Aoki et al. |
| 6,847,062 B2 | 1/2005 | Ohnishi et al. |
| 7,217,628 B2 * | 5/2007 | Sheridan et al. ............ 438/322 |
| 7,227,176 B2 | 6/2007 | Wu et al. |
| 7,416,957 B2 | 8/2008 | Ponomarev |
| 7,485,538 B1 | 2/2009 | Ramdani et al. |
| 2001/0055893 A1 | 12/2001 | Norstrom et al. |
| 2007/0051980 A1 | 3/2007 | Hodge et al. |
| 2007/0102834 A1 | 5/2007 | Enicks et al. |
| 2013/0126944 A1 | 5/2013 | Adam et al. |
| 2013/0168820 A1 | 7/2013 | Adam et al. |
| 2013/0187198 A1 | 7/2013 | Camillo-Castillo et al. |

FOREIGN PATENT DOCUMENTS

| | | |
|---|---|---|
| EP | 1 303 872 | 12/2012 |
| WO | 2007/056708 | 5/2007 |

* cited by examiner

BASE PROFILE OF SELF-ALIGNED BIPOLAR TRANSISTORS FOR POWER AMPLIFIER APPLICATIONS

BACKGROUND

The present disclosure relates generally to integrated circuit devices, and more specifically, to a self-aligned bipolar transistor.

A bipolar junction transistor (BJT or bipolar transistor) is a type of transistor that relies on the contact of two types of semiconductor for its operation. One type of semiconductor is formed with positive-type dopants, and is therefore referred to as a P-type semiconductor, while another type of semiconductor is formed with negative-type dopants, and is therefore referred to as an N-type semiconductor. A bipolar junction transistor usually includes two back-to-back p-n junctions that share a thin common region. In other words, a bipolar junction transistor typically includes three regions, two outer regions commonly known as "emitter" and "collector" respectively, and a middle region commonly known as "base". Electrical connections are generally made to all three regions.

Bipolar junction transistors can be used as amplifiers, switches, or in oscillators. Bipolar junction transistors come in two types, or polarities, known as PNP and NPN, with the P and the N representing the different doping types of the three main terminal regions (collector, base, and emitter). An NPN transistor comprises two semiconductor junctions that share a thin P-doped anode region, and a PNP transistor comprises two semiconductor junctions that share a thin N-doped cathode region.

Improvement in transistor performance, especially its operation speed, is generally considered as essential for achieving improved performance of an integrated circuit wherein various types of transistors are normally used. Bipolar transistors with a silicon germanium ("SiGe") intrinsic base may be capable of delivering performance required for such integrated circuit. To achieve higher electrical performance, these transistors typically have a doped polysilicon extrinsic base layer on top of or adjacent to the epitaxially grown intrinsic SiGe base. So far, SiGe-HBTs have demonstrated cut-off frequency ($f_T$) of up to 400 GHz. The emitter to collector transit time of such a transistor is typically reduced by optimizing the Ge/Si ratio, doping profile, and film thickness of the epitaxially grown intrinsic SiGe base. Such devices are used, for example, in integrated circuits fabricated for high performance mixed signal applications.

SUMMARY

According to a bipolar transistor structure having a transistor top and a transistor bottom herein, a silicon substrate located at the transistor bottom has a collector region of a first conductivity type. An epitaxial base layer of a second conductivity type overlies, relative to the transistor top and the transistor bottom, a portion of the collector region. The epitaxial base layer has a bottom surface on the silicon substrate and a top surface opposite the bottom surface. A top region, relative to the transistor top and the transistor bottom, of the epitaxial base layer comprises a concentration of germanium having atomic compositions sufficient to avoid impacting transistor parameters, and sufficient to be resistant to selective chemical etching. A silicon emitter layer of the first conductivity type overlies, relative to the transistor top and the transistor bottom, a portion of the epitaxial base layer adjacent to the top surface of the epitaxial base layer.

According to a device having a device top and a device bottom herein, an n-type doped collector of a bipolar transistor is disposed in an upper portion, relative to the device top and the device bottom, of a silicon (Si) substrate layer. A base of p-type doped epitaxial silicon germanium (SiGe) is disposed on the substrate above, relative to the device top and the device bottom, the n-type doped collector. A top region of the base, relative to the device top and the device bottom, comprises a concentration of germanium (Ge) having atomic compositions sufficient to avoid impacting transistor parameters, and sufficient to be resistant to selective chemical etching. An n-type doped silicon (Si) emitter contacts the base.

According to a method of forming a bipolar transistor structure herein, a collector region of a first conductivity type is formed within a semiconductor substrate. A base of a second conductivity type is formed on a portion of the collector region. An etch-stop region is formed in a surface layer of the base. The surface layer is located opposite the semiconductor substrate. A concentration of germanium in the etch-stop region is controlled to have atomic compositions sufficient to avoid impacting transistor parameters and sufficient to be resistant to selective chemical etching. An emitter of the first conductivity type is formed on the etch-stop region of the base.

BRIEF DESCRIPTION OF THE DRAWINGS

The devices and methods herein will be better understood from the following detailed description with reference to the drawings, which are not necessarily drawn to scale and in which.

DETAILED DESCRIPTION

Figure 1:
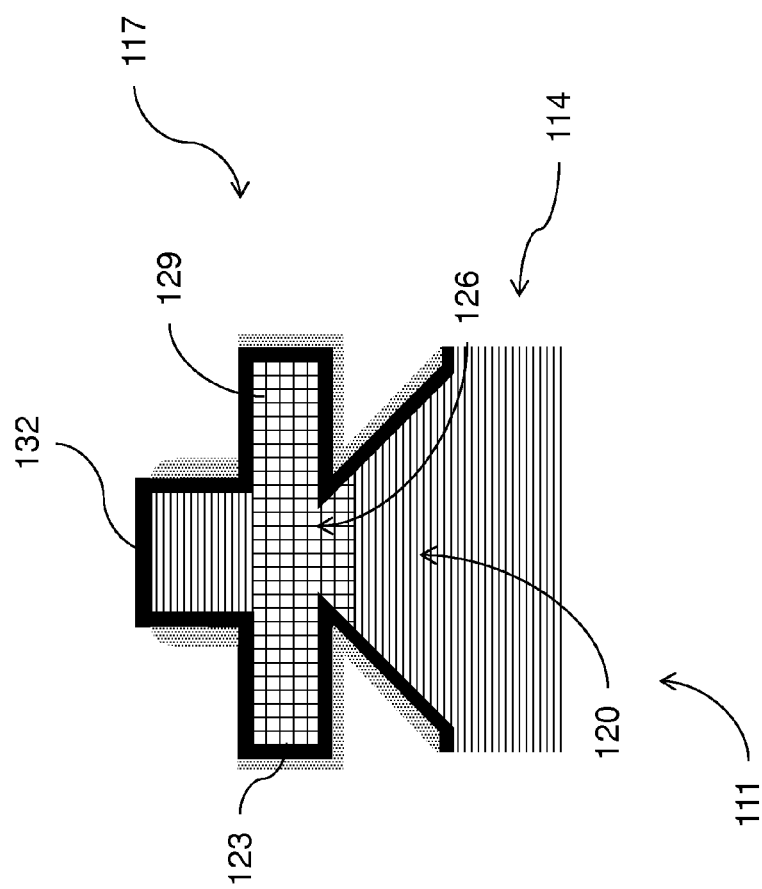
FIG. 1 is an elevational view of a bipolar transistor structure according to devices and methods herein.

It will be readily understood that the devices and methods of the present disclosure, as generally described and illustrated in the drawings herein, may be arranged and designed in a wide variety of different configurations in addition to the devices and methods described herein. Thus, the following detailed description of the devices and methods, as represented in the drawings, is not intended to limit the scope defined by the appended claims, but is merely representative of selected devices and methods. The following description is intended only by way of example, and simply illustrates certain concepts of the devices and methods, as disclosed and claimed herein.

Referring to the drawings, FIG. 1 shows a portion of a semiconductor wafer, indicated generally as 111. The wafer 111 comprises a multi-layer substrate 114 forming a transistor 117. Generally, transistor structures are formed by depositing or implanting impurities into a substrate to form at least one semiconductor channel region, bordered by shallow trench isolation regions below the top (upper) surface of the substrate. A "substrate" herein can comprise any material appropriate for the given purpose (whether now known or developed in the future) and can comprise, for example, Si, SiC, SiGe, SiGeC, other III-V or II-VI compound semiconductors, or organic semiconductor structures, etc. The shallow trench isolation structures are well-known to those ordinarily skilled in the art and are generally formed by patterning openings/trenches within the substrate and growing or filling the openings with a highly insulating material (this allows different active areas of the substrate to be electrically isolated from one another).

The transistor 117 includes a collector 120, a base 123 comprising an intrinsic base portion 126 and an extrinsic base portion 129, and a self-aligned emitter 132. The base 123 may be a thick layer providing more mechanical strength and lower base resistance. Moreover, the flat, top portion enables better silicide formation, as described in more detail below. Each of the collector 120, base 123, and emitter 132 is formed in one or more layers of the multi-layer substrate 114, as described in further detail below. Typically, in bipolar complementary metal oxide semiconductor (BiCMOS) transistors, the collector 120 is in the substrate 114, where CMOS FETs are built first. The base 123 and the emitter 132 are created later. The base 123 is grown epitaxially. Typically, the emitter 132 is formed by deposition of poly silicon. According to devices and methods herein, the emitter layer is grown epitaxially, in order to make it substantially single crystalline.

Figure 2:
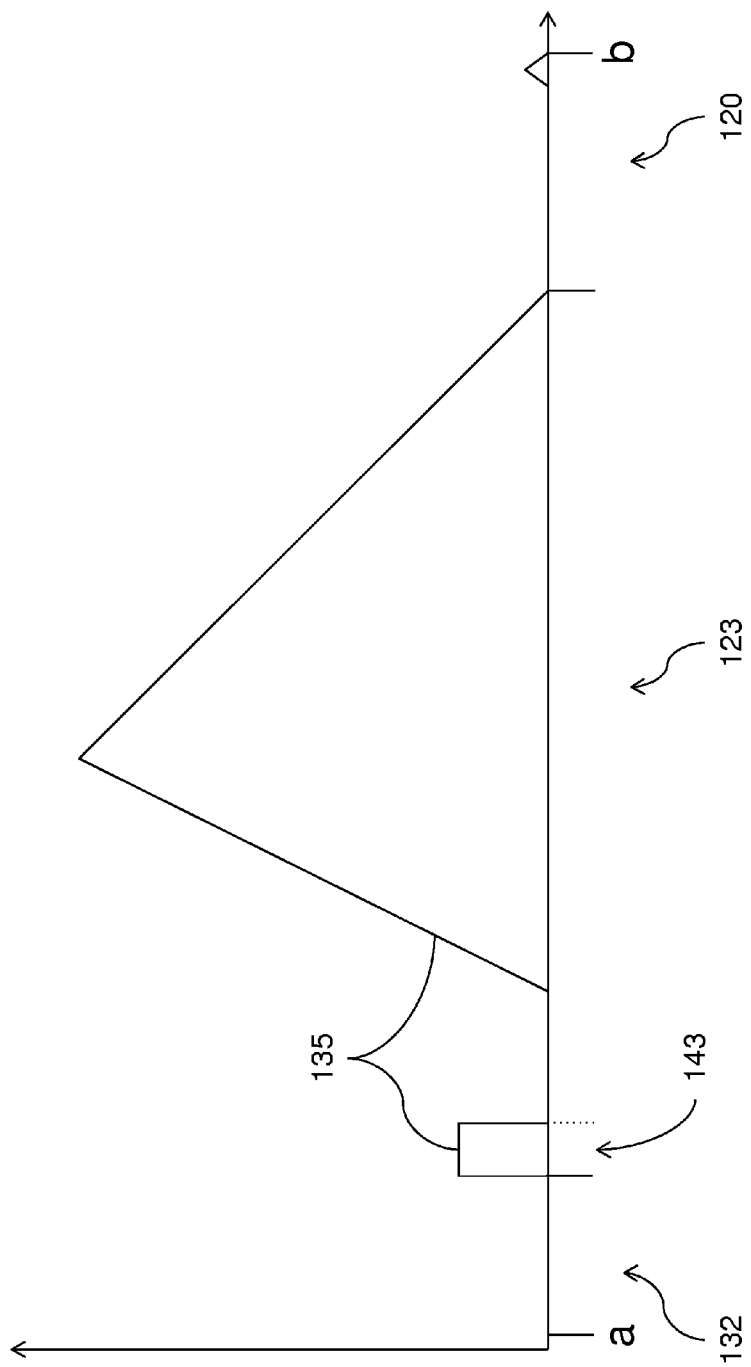
FIG. 2 is a graph showing the profiles of constituent in the base portion according to devices and methods herein.

FIG. 2 shows a specific structural profile for the base portion of the transistor 117 in FIG. 1. In FIG. 2, the abscissa represents the depth from the upper surface of the layer forming the emitter 132 (labeled 'a') to the bottom surface of the layer forming the collector 120 (labeled 'b'), and the ordinate represents the content or concentration of germanium (Ge) (indicated by the solid line 135). Carbon and boron (not shown) may also be included during a certain stage of the epitaxial growth of the base layer, as is known to those skilled in the art.

According to the specific profile shown in FIG. 2, the germanium profile shows that the Ge content in the layer forming the base 123 is at a minimum (about 0%) at the interface between the base 123 and the collector 120 as well as at some point between the top surface of the base 123 and the emitter 132. The concentration of germanium increases in the layer to a maximum (up to about 40%) between the top interface and the bottom interface. Additionally, the base 123 includes an etch-stop region 143 having a thin layer of germanium (up to about 15%) at the surface. Note: a triangular Ge profile (in cross-section) is shown, other profiles, such as a trapezoid shape (in cross-section) are also applicable.

In the base profile, the components maintain mechanical strength of the structure. According to devices and methods herein, the etch-stop region 143 of the base 123 is built with a surface layer or layers such that the top surface layer or entire layers have Ge atomic compositions that are low enough (e.g., <15%) not to impact the original device parameters, but high enough (e.g., >1%) to be resistant to selective chemical etching. According to devices and methods herein, the etch-stop layer may be formed in the base portion in one epitaxial growth step.

Figure 3:
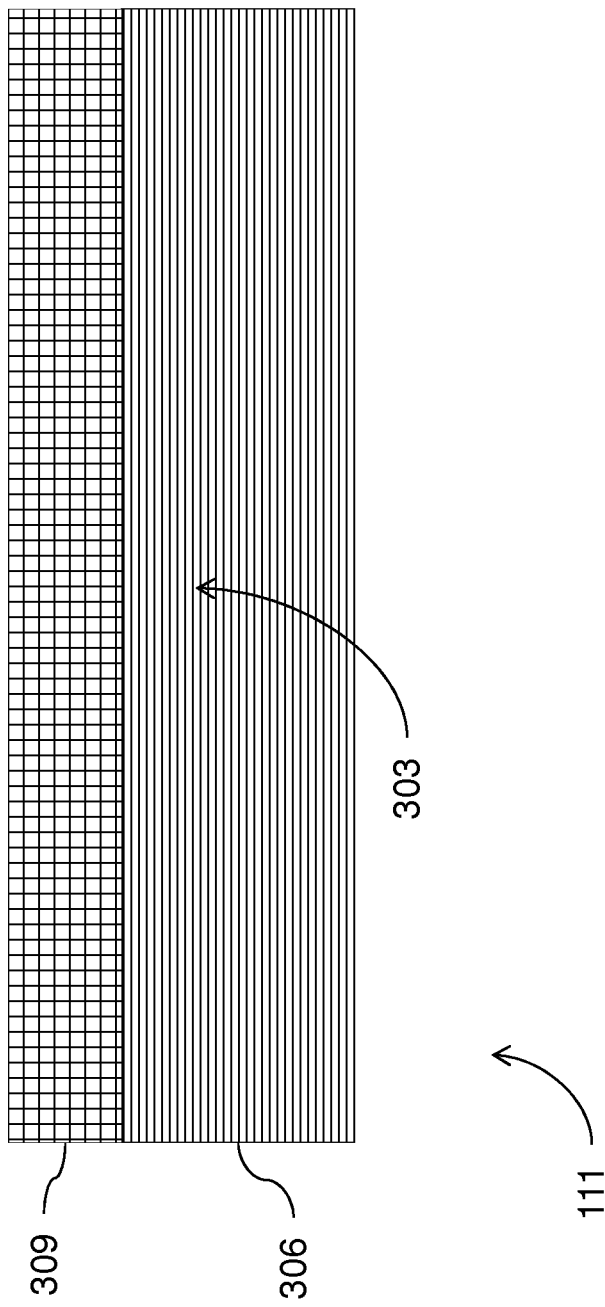
FIG. 3 is a schematic diagram of a partially completed integrated circuit structure according to devices and methods herein.

FIGS. 3-13 illustrate an integrated circuit structure (e.g., bipolar junction transistor) in various processing stages. More specifically, as illustrated in FIG. 3, exemplary methods herein form an n-type dopant-implanted sub-collector region 303 within a substrate 306. The substrate 306 may comprise any conventional semiconductor substrate such as, for example, a bulk silicon substrate or an active layer of semiconductor material of a silicon-on-insulator (SOI) wafer. The methods herein epitaxially grow a base layer 309 from the substrate 306. In one example, the epitaxial growth process can be a low temperature epitaxial (LTE) growth process (typically at a growth temperature ranging from 400° C. to 850° C.). Epitaxial films may be grown from gaseous or liquid precursors. Because the substrate 306 acts as a seed crystal, the deposited film of the base layer 309 may lock into one or more crystallographic orientations with respect to the crystal orientation of the substrate 306. The base layer 309 is epitaxially grown having a predetermined SiGe base profile, such as the one illustrated in FIG. 2.

As noted above, bipolar junction transistors are generally either NPN or PNP semiconductor structures; therefore, the polarity of the dopant for the collector region 303 will be opposite the polarity of the dopant used for the material of the base layer 309. For purposes herein, a "semiconductor" is a material or structure that may include an implanted impurity or may be in-situ doped during the epitaxial growth, which allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

A positive-type transistor "P-type transistor" uses impurities such as boron, indium or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Also for purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam, and then patterned. Alternatively, the dielectrics herein may be formed from any of the many candidate high dielectric constant (high-k) materials, including but not limited to silicon nitride, silicon oxynitride, a dielectric stack of $SiO_2$ and $Si_3N_4$, and metal oxides like tantalum oxide. The thickness of dielectrics herein may vary contingent upon the required device performance.

Figure 4:
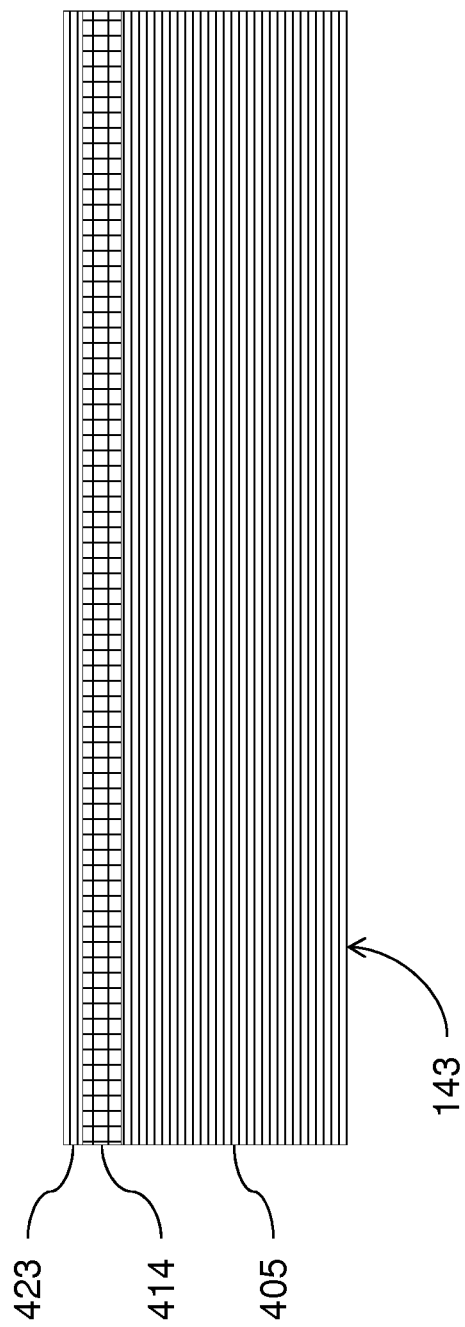
FIG. 4 is a schematic diagram of an enlarged portion of the partially completed integrated circuit structure according to devices and methods herein.

FIG. 4 shows an enlarged view of the etch-stop region 143 of the base 123 forming the etch-stop layer, according to devices and methods herein. The etch-stop region 143 may comprise a silicon region 405 sandwiched between the base layer 309 and a thin silicon germanium (SiGe) region 414. The thin SiGe region 414 may have Ge atomic compositions that are sufficient, e.g., <15%, not to impact the original device parameters, but sufficient, e.g., >1%, to be resistant to selective chemical etch. According to devices and methods herein, an additional thin layer of Si 423 may be provided on the SiGe region 414 on top of the profile.

Figure 5:
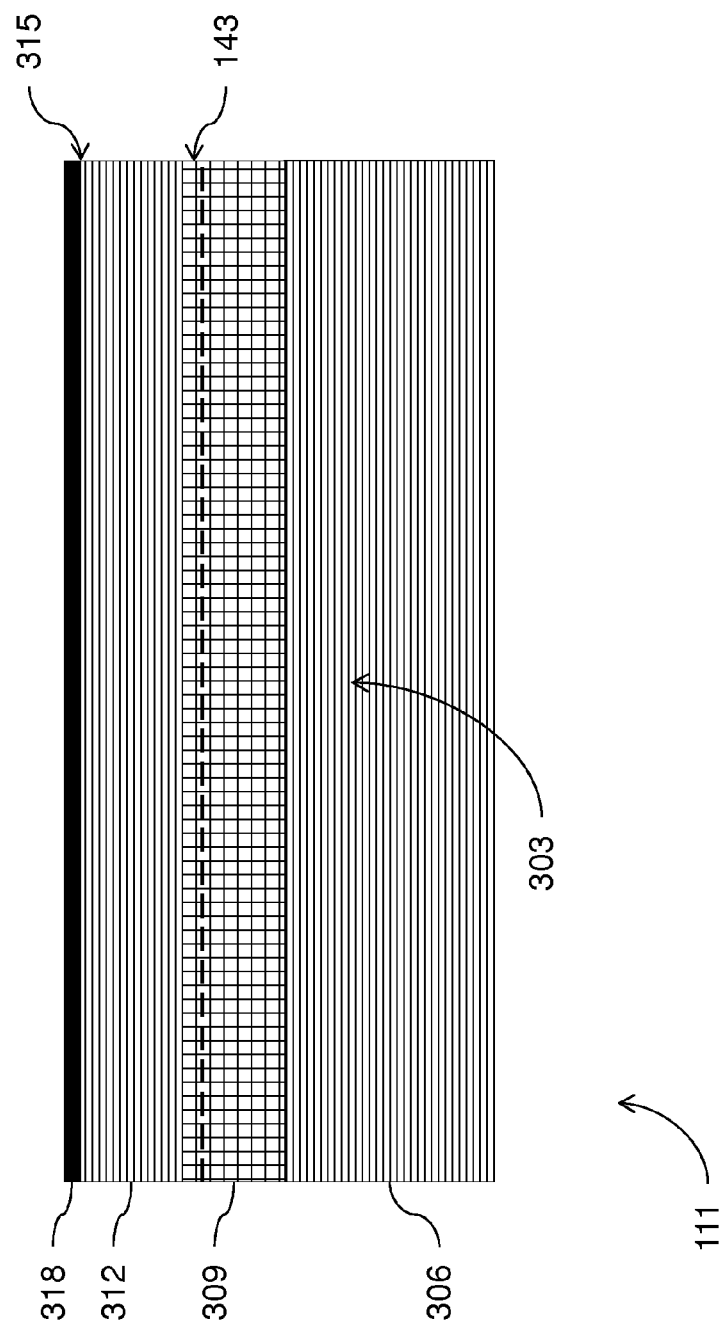
FIG. 5 is a schematic diagram of a partially completed integrated circuit structure according to devices and methods herein.

As shown in FIG. 5, an in-situ doped (ISD) emitter layer 312 is deposited on the base layer 309, above the etch-stop region 143. According to devices and methods herein, the emitter layer 312 may be heavily doped initially, and undoped at the surface layer 315. The processing steps then form an insulating layer 318 (such as a deposited or oxidized material) on the top of the emitter layer 312. Many different insulators could be utilized by various deposition techniques.

Figure 6:
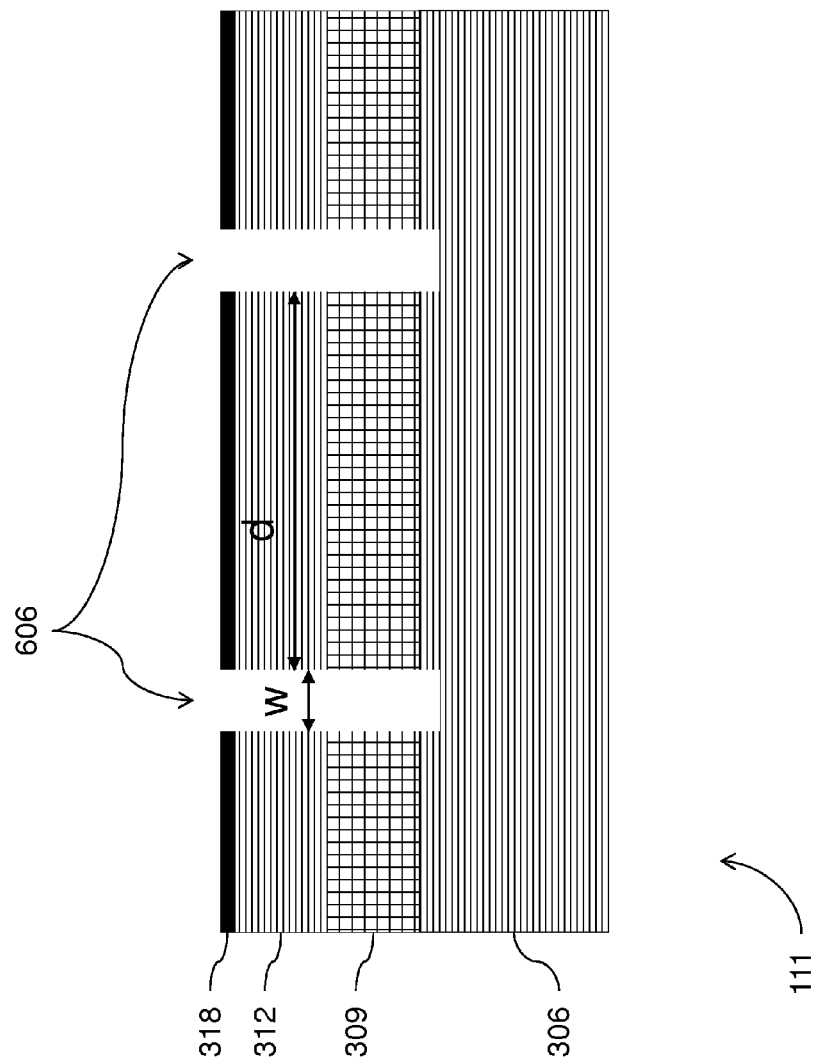
FIG. 6 is a schematic diagram of a partially completed integrated circuit structure according to devices and methods herein.

Referring to FIG. 6, narrow isolation trenches 606 are etched through the emitter layer 312 and base layer 309, and at least partially into the substrate 306. Any suitable etch may be used to form the trenches 606, such as a selective RIE process. In general, two trenches 606 may be formed, one on the left and another one on the right. In one non-limiting example, the trenches 606 may have a width "w" of about 0.2 μm and a space between the two trenches "d" of about 1.2 μm. It is contemplated that the present disclosure is not limited to these exemplary dimensions, however, and any suitable width and diameter may be used with the trench 606 as appropriate.

Figure 7:
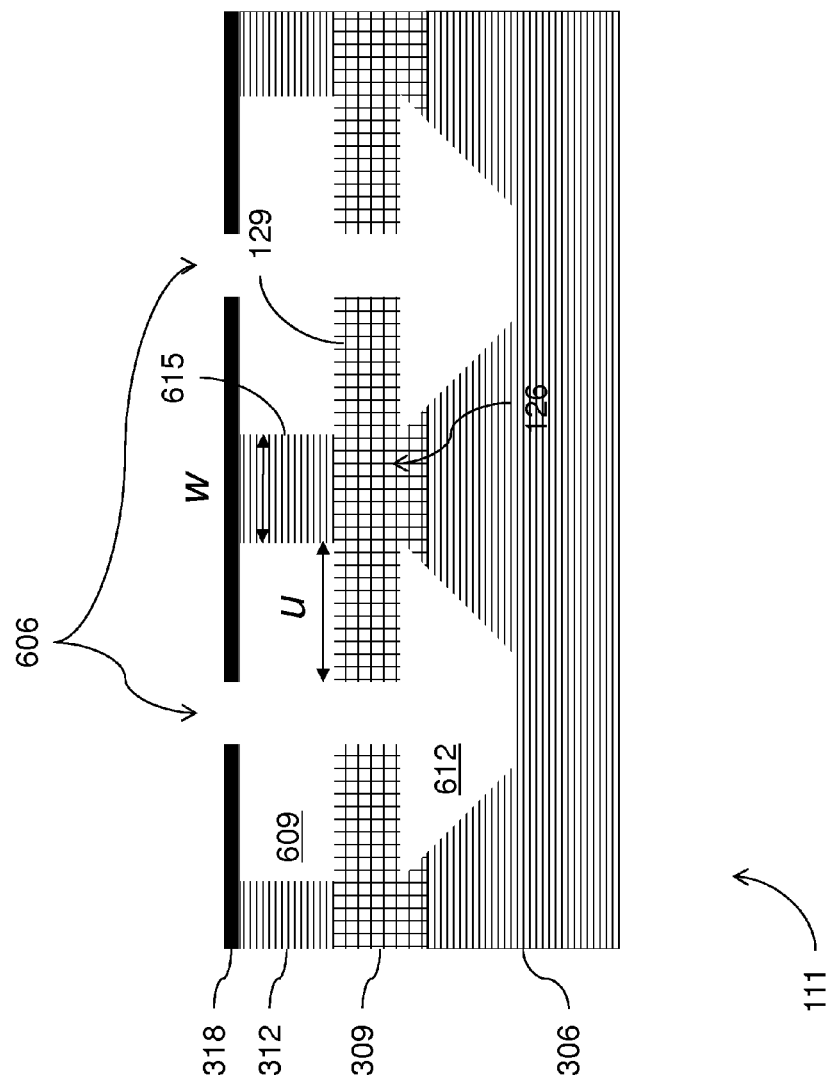
FIG. 7 is a schematic diagram of a partially completed integrated circuit structure according to devices and methods herein.

As shown in FIG. 7, undercuts are formed in the trenches 606. A top undercut 609 is formed in the emitter layer 312, and a bottom undercut 612 is formed in a portion of the base layer 309 and a portion of the substrate 306. In one non-limiting example, the top undercut 609 may go laterally a distance "u" of about 0.4 μm leaving an emitter stack 615 having a width "w" of about 0.4 μm. It is contemplated that the present disclosure is not limited to these exemplary dimensions, however, and any suitable size of the top and bottom undercuts 609, 612 may be used, as appropriate. Note: by undercutting, the sidewall of the emitter stack 615 may not be entirely straight. The bottom undercut 612 may be wedge-shaped to form the intrinsic base portion 126 and the overhanging extrinsic base portion 129 of the transistor 117.

Figure 8:
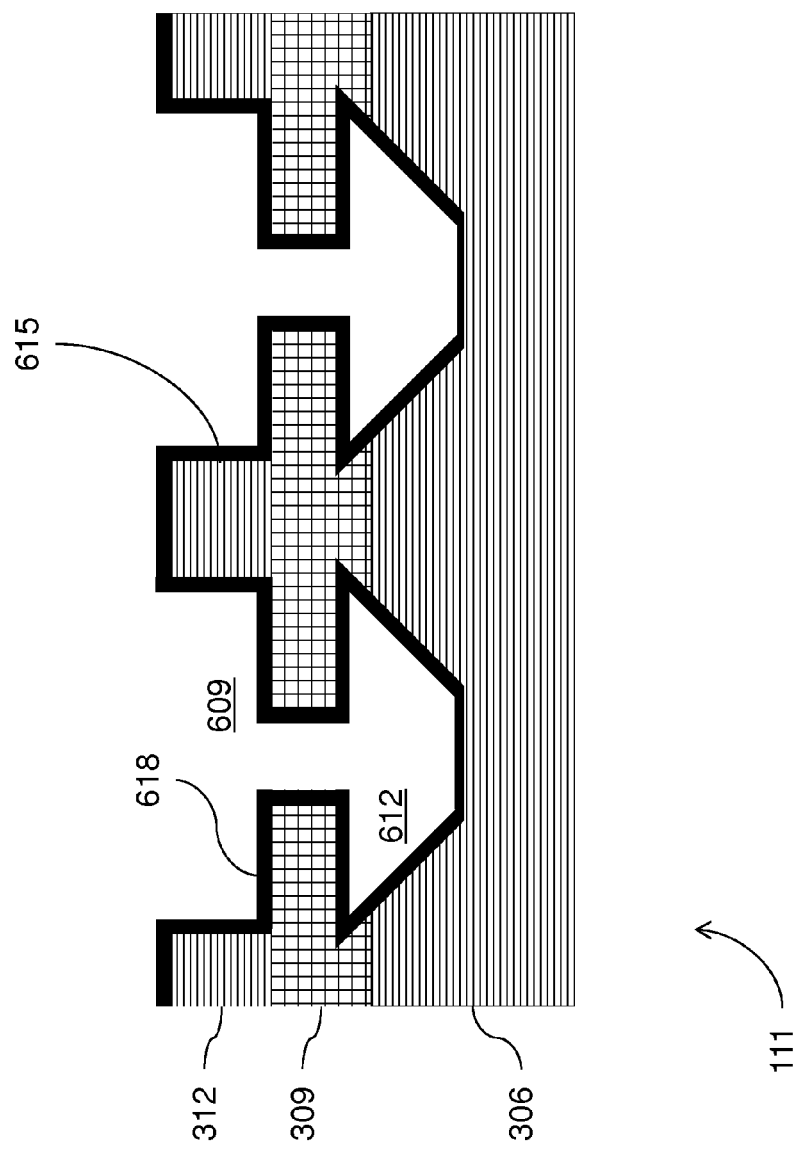
FIG. 8 is a schematic diagram of a partially completed integrated circuit structure according to devices and methods herein.

Referring to FIG. 8, a passivation liner 618 comprising an electrical insulator material may be formed on the exposed surfaces of the top undercut 609 and bottom undercut 612, including the sidewalls and bottom. The passivation liner 618 may be formed by thermal oxidation and/or a thin layer of oxide deposition. It is contemplated that the passivation liner 618 may be formed using conventional semiconductor processes and any suitable insulator material. For example, the passivation liner 618 may be formed using a conformal deposition process, such as chemical vapor deposition (CVD). In some non-limiting examples, the passivation liner 618 may be composed of the same material as the insulating layer 318, e.g., silicon dioxide. According to devices and methods herein, the passivation liner 618 may be thinly formed. For example, the passivation liner 618 may have a thickness of only about 5 Å, although other thicknesses may be used.

Figure 9:
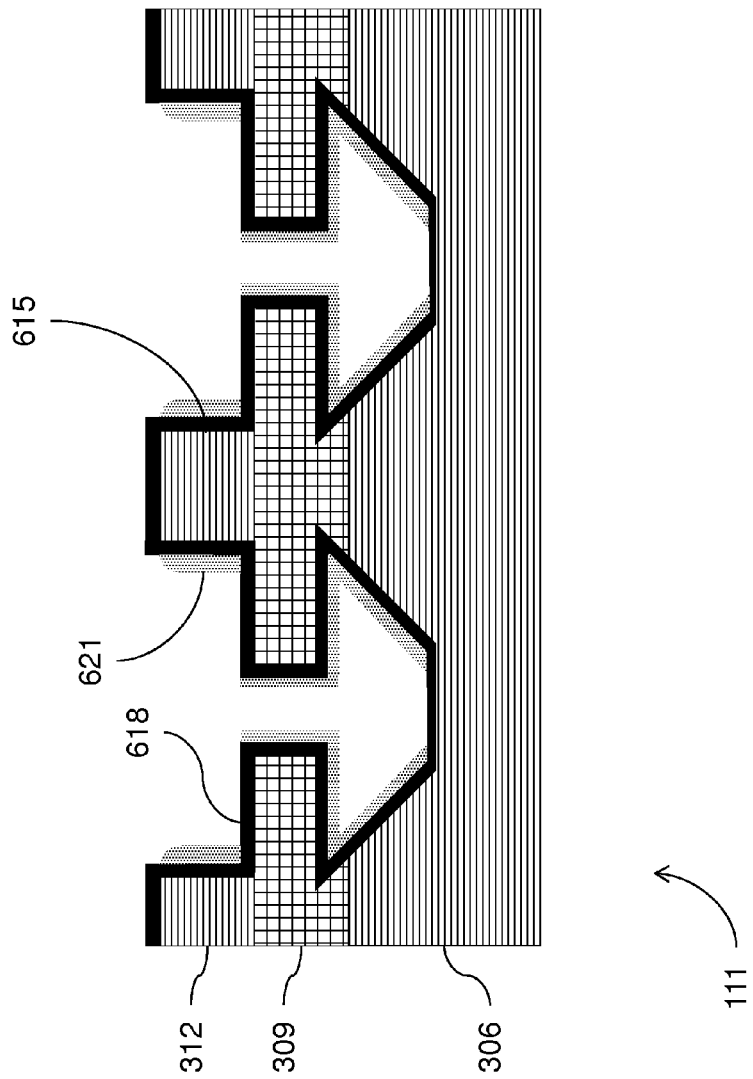
FIG. 9 is a schematic diagram of a partially completed integrated circuit structure according to devices and methods herein.

Following sidewall passivation, nitride sidewall spacers 621 may be formed on the passivation liner 618, as shown in FIG. 9. According to devices and methods herein, the processing steps deposit a nitride layer and etch the nitride to form the sidewall spacers 621. For purposes herein, "sidewall spacers" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than it removes material from vertical surfaces, thereby leaving insulating material along the vertical sidewalls of structures. This material left on the vertical sidewalls is referred to as sidewall spacers.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a positive resist (illuminated portions remain) or negative resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

Figure 10:
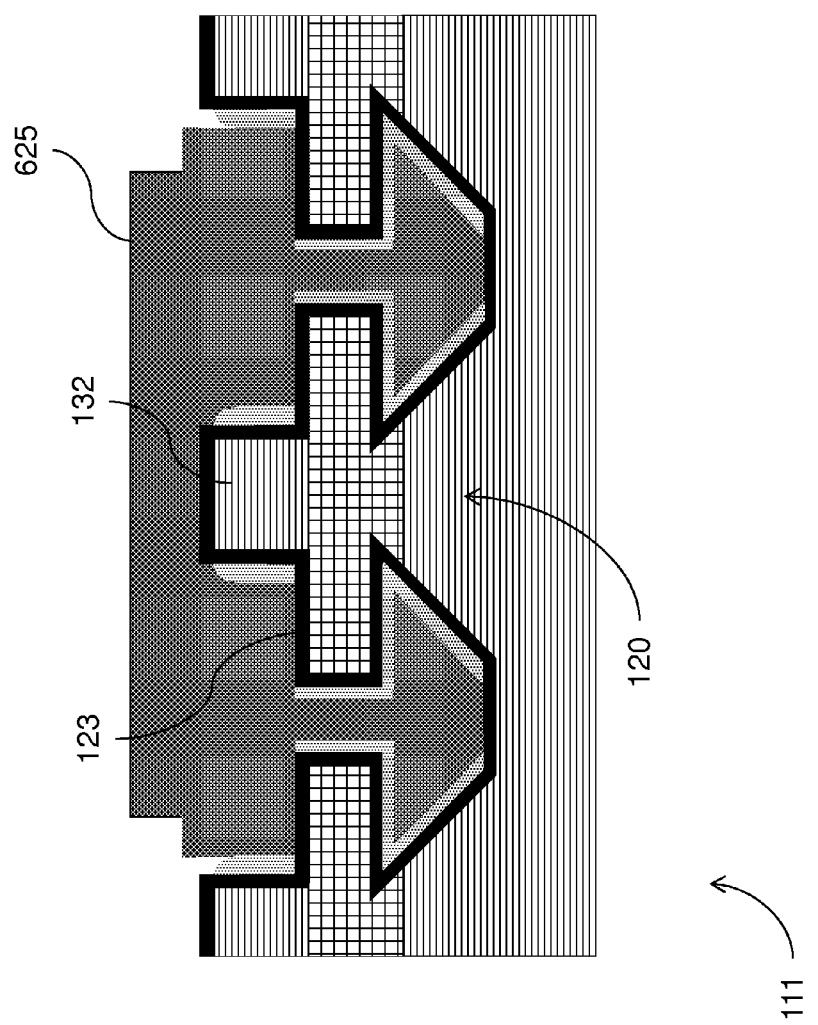
FIG. 10 is a schematic diagram of a partially completed integrated circuit structure according to devices and methods herein.
Figure 11:
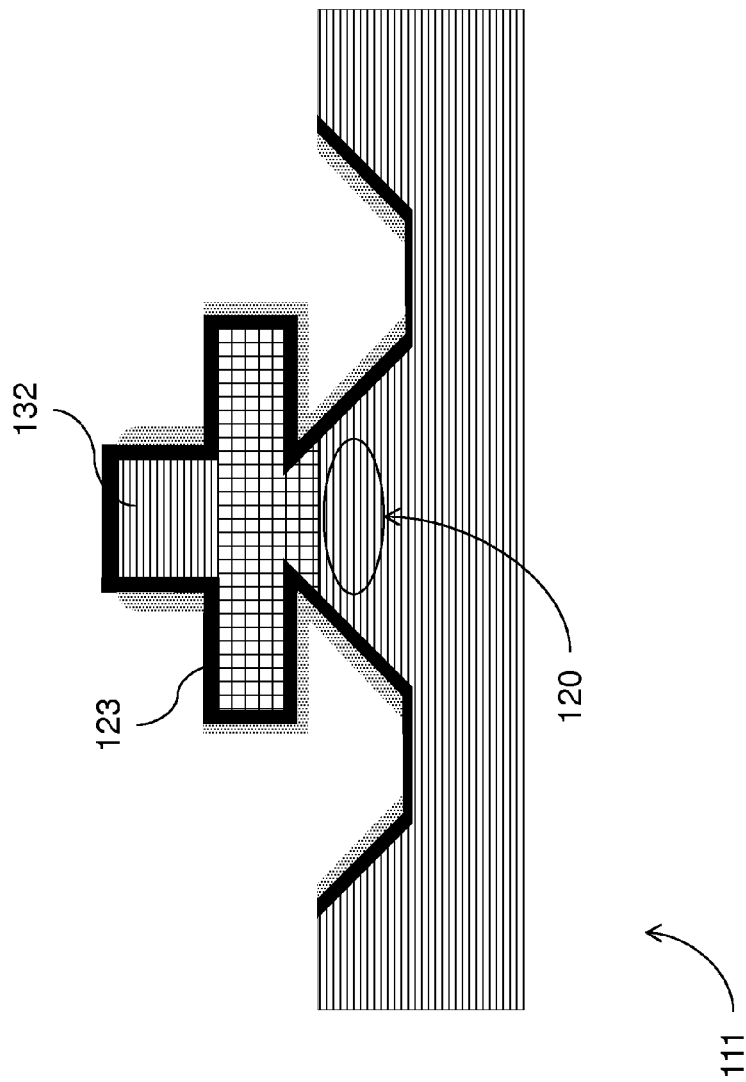
FIG. 11 is a schematic diagram of a partially completed integrated circuit structure according to devices and methods herein.

In FIG. 10, a photo resist mask 625 may be applied to protect the contact regions for the base 123 and emitter 132. Non-selective RIE can be used to open contact regions for the collector 120, as shown in FIG. 11.

Figure 12:
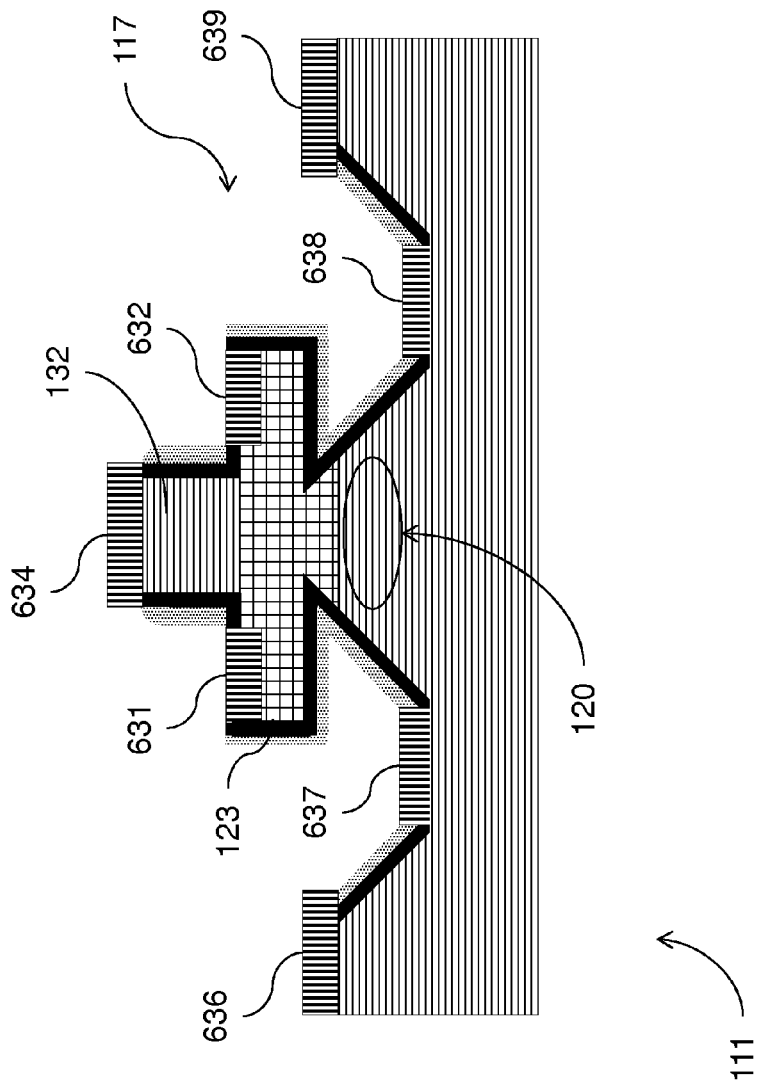
FIG. 12 is a schematic diagram of a partially completed integrated circuit structure according to devices and methods herein.

As depicted in FIG. 12, portions of the dielectric layer are removed, and conventional processes may then be carried out to complete formation of the transistor 117, including forming self aligned silicide pads 631, 632 on the base 123, silicide pad 634 on the emitter 132, and silicide pads 636, 637, 638, 639 for the collector 120. For example, $TiSi_2$, $CoSi_2$, or NiSi silicides may be formed by conventional processes including titanium or cobalt deposition followed by silicide formation and annealing processes to achieve the low electrical resistance silicide phase, as is known in the art.

Figure 13:
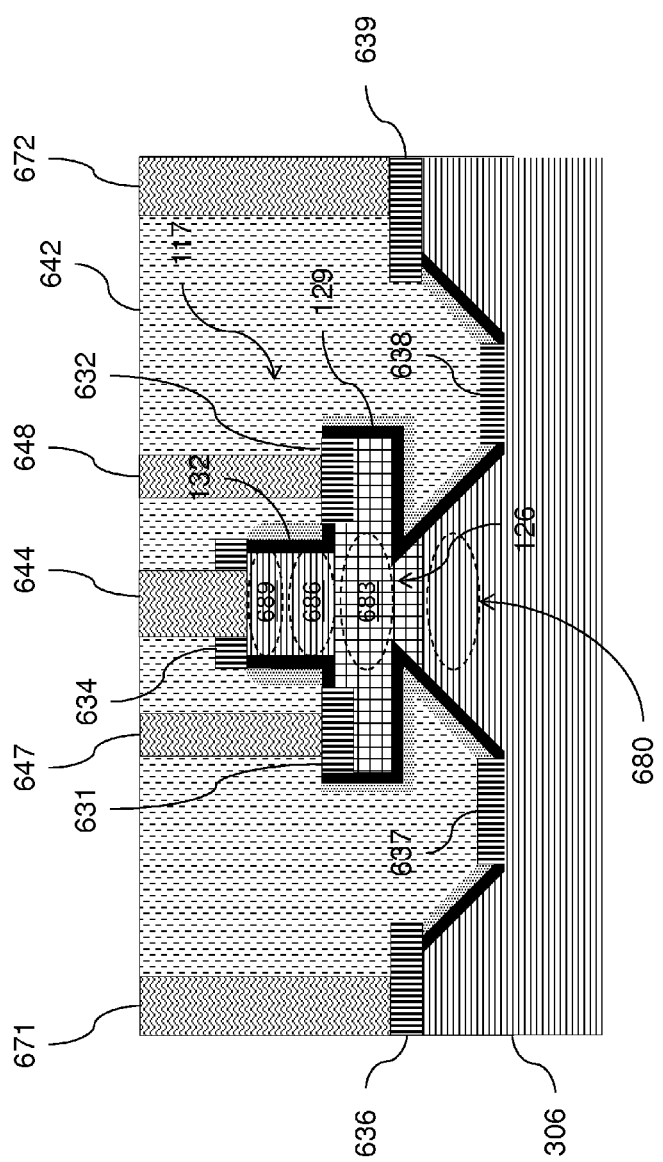
FIG. 13 is a schematic diagram of a partially completed integrated circuit structure according to devices and methods herein.

As depicted in FIG. 13, the trenches may be filled by a barrier nitride layer and a dielectric material 642 comprising any suitable insulator, such as silicon dioxide ($SiO_2$), borophosphosilicate glass (BPSG), etc. Contacts may be formed in the dielectric material 642 to provide electrical connections to the transistor 117. For example, an emitter contact 644 may be formed to connect to the silicide pad 634 on the emitter 132. One or more base contacts, such as 647, 648 may be formed to connect to the silicide pads 631, 632 on the base 123. One or more collector contacts, such as 671, 672 may be formed to connect to the silicide pads 636, 639 for the collector 120. Collector contacts can also be made to the silicide pads 637, 638 at the bottom of the trenches. The contacts may be formed in any desired manner, such as masking the dielectric material 642, etching trenches in the dielectric material 642, and filling the trenches with an electrically conductive material (e.g., tungsten, etc.), followed by chemical-mechanical polishing (CMP) of conductive material outside the trenches. Multiple-levels of metal wiring may be used to link transistors in a pre-determined way, as is well known in the art.

Thus, as shown, such methods produce various integrated circuit structures (such as PNP or NPN bipolar junction transistors). Such integrated circuit structures include a collector region 680 within a substrate 306. An epitaxial base material is positioned on the collector region 680. The epitaxial base material has a SiGe base profile, e.g. as illustrated in FIG. 2. This epitaxial base material comprises a base region 683 on the collector region 680. Further, an emitter 132 is positioned on the base region 683. The emitter 132 comprises a first region 686, contacting the base region 683, comprising silicon and a second region 689, remote from the base region 683, comprising a concentration of germanium.

Figure 14:
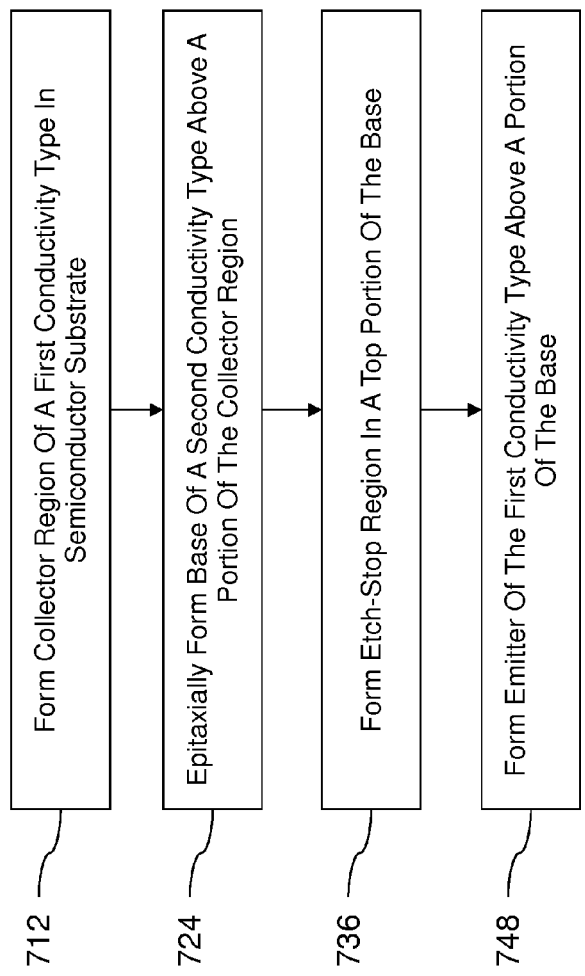
FIG. 14 is a flow diagram illustrating devices and methods herein.

FIG. 14 is a flow diagram illustrating the processing flow of an exemplary method of fabricating a bipolar transistor structure according to devices and methods herein. At 712, a collector region of a first conductivity type is formed in a semiconductor substrate. A base of a second conductivity type is epitaxially formed above a portion of the collector region, at 724. A concentration of germanium in the base is controlled initially from a minimum amount. The concentration of germanium in the base is gradually increased to a maximum amount. Then the concentration of germanium in the base is gradually decreased to the minimum amount. At 736, an etch-stop region is formed in a top portion of the base. The etch-stop region may have Ge atomic compositions that are sufficient, e.g., <15%, not to impact the original device parameters, but sufficient, e.g., >1%, to be resistant to selective chemical etch. An emitter of the first conductivity type is formed above a portion of the base, at 748.

The methods described herein can be used in fabricating a Silicon Germanium (SiGe) bipolar device or any complementary metal oxide semiconductor (CMOS) device.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For electronic applications, semiconducting substrates, such as silicon wafers, can be used. The substrate enables easy handling of the micro device through the many fabrication steps. Often, many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

A device according to devices and methods herein may include a silicon substrate having a collector region of a first conductivity type. An epitaxial base layer of a second conductivity type overlies a portion of the collector region. The epitaxial base layer has a bottom surface on the silicon substrate and a top surface. A concentration of germanium is at a minimum adjacent to the top surface and the bottom surface and the concentration of germanium increases to a maximum between the top surface and the bottom surface. A silicon emitter layer of the first conductivity type overlies a portion of the epitaxial base layer adjacent to the top surface of the epitaxial base layer. The silicon emitter layer comprises a first region, contacting the epitaxial base layer, comprising silicon and a second region, remote from the epitaxial base layer, comprising a concentration of germanium.

While only one or a limited number of transistors are illustrated in the drawings, those ordinarily skilled in the art would understand that many different types of transistors could be simultaneously formed with the devices herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

Aspects of the present disclosure are described herein with reference to flowchart illustrations and/or block diagrams of methods, apparatus (systems), and computer program products according to various devices and methods. It will be understood that each block of the flowchart illustrations and/or two-dimensional block diagrams, and combinations of blocks in the flowchart illustrations and/or block diagrams, can be implemented by computer program instructions. The computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

According to a further devices and methods herein, an article of manufacture is provided that includes a tangible computer readable medium having computer readable instructions embodied therein for performing the steps of the computer implemented methods, including, but not limited to, the method illustrated in FIG. 14. Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. Any of these devices may have computer readable instructions for carrying out the steps of the methods described above with reference to FIG. 14.

The computer program instructions may be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Furthermore, the computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In case of implementing the devices and methods herein by software and/or firmware, a program constituting the software may be installed into a computer with dedicated hardware, from a storage medium or a network, and the computer is capable of performing various functions if with various programs installed therein.

Figure 15:
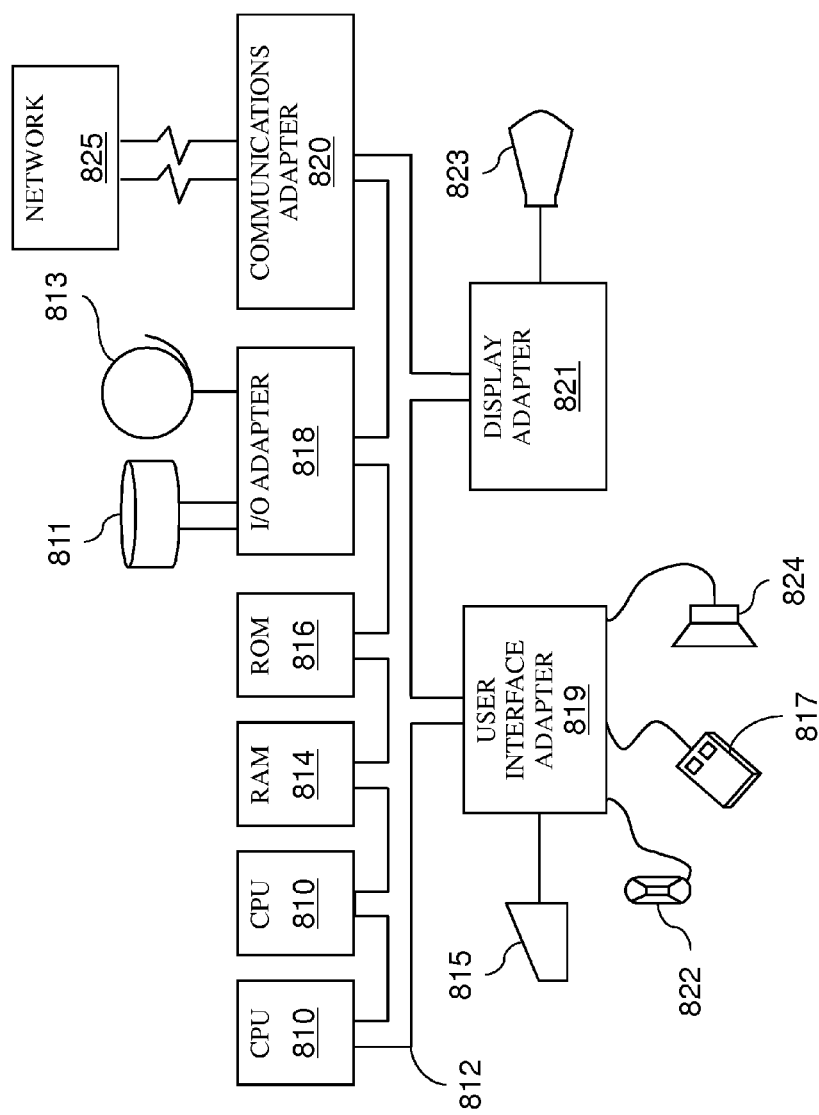
FIG. 15 is a schematic diagram of a hardware system according to devices and methods herein.

A representative hardware environment for practicing the devices and methods herein is depicted in FIG. 15. This schematic drawing illustrates a hardware configuration of an information handling/computer system in accordance with the devices and methods herein. The system comprises at least one processor or central processing unit (CPU) 810. The CPUs 810 are interconnected via system bus 812 to various devices such as a Random Access Memory (RAM) 814, Read-Only Memory (ROM) 816, and an Input/Output (I/O) adapter 818. The I/O adapter 818 can connect to peripheral devices, such as disk units 811 and tape drives 813, or other program storage devices that are readable by the system. The system can read the inventive instructions on the program storage devices and follow these instructions to execute the methodology of the devices and methods herein.

In FIG. 15, CPUs 810 perform various processing based on a program stored in a Read Only Memory (ROM) 816 or a program loaded from a peripheral device, such as disk units 811 and tape drives 813 to a Random Access Memory (RAM) 814. In the RAM 814, required data when the CPUs 810 perform the various processing or the like is also stored, as necessary. The CPUs 810, the ROM 816, and the RAM 814 are connected to one another via a bus 812. An I/O adapter 818 is also connected to the bus 812 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 814, as necessary.

The system further includes a user interface adapter 819 that connects a keyboard 815, mouse 817, speaker 824, microphone 822, and/or other user interface devices such as a touch screen device (not shown) to the bus 812 to gather user input. Additionally, a communication adapter 820 including a network interface card such as a LAN card, a modem, or the like connects the bus 812 to a data processing network 825. The communication adapter 820 performs communication processing via a network such as the Internet. A display adapter 821 connects the bus 812 to a display device 823, which may be embodied as an output device such as a monitor (such as a Cathode Ray Tube (CRT), a Liquid Crystal Display (LCD), or the like), printer, or transmitter, for example.

In the case where the above-described series of processing is implemented with software, the program that constitutes the software may be installed from a network such as the Internet or a storage medium such as the removable medium.

Those skilled in the art would appreciate that the storage medium is not limited to the peripheral device having the program stored therein as illustrated in FIG. 15, which is distributed separately from the device for providing the program to the user. Examples of a removable medium include a magnetic disk (including a floppy disk), an optical disk (including a Compact Disk-Read Only Memory (CD-ROM) and a Digital Versatile Disk (DVD)), a magneto-optical disk (including a Mini-Disk (MD) (registered trademark)), and a semiconductor memory. Alternatively, the storage medium may be the ROM 816, a hard disk contained in the storage section of the disk units 811, or the like, which has the program stored therein and is distributed to the user together with the device that contains them.

As will be appreciated by one skilled in the art, aspects of the devices and methods herein may be embodied as a system, method, or computer program product. Accordingly, aspects of the present disclosure may take the form of an entirely hardware system, an entirely software system (including firmware, resident software, micro-code, etc.) or an system combining software and hardware aspects that may all generally be referred to herein as a "circuit," "module", or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a Read-Only Memory (ROM), an Erasable Programmable Read-Only Memory (EPROM or Flash memory), an optical fiber, a magnetic storage device, a portable compact disc Read-Only Memory (CD-ROM), an optical storage device, a "plug-and-play" memory device, like a USB flash drive, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The flowchart and block diagrams in the Figures illustrate the architecture, functionality, and operation of possible implementations of systems, methods, and computer program products according to various devices and methods herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular devices and methods only and is not intended to be limiting of this disclosure. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various devices and methods herein have been presented for purposes of illustration, but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein.

What is claimed is:

1. A bipolar transistor structure having a transistor top and a transistor bottom, said structure comprising:
    a silicon substrate located at said transistor bottom and having a collector region of a first conductivity type;
    an epitaxial base layer of a second conductivity type overlying, relative to said transistor top and said transistor bottom, a portion of said collector region, said epitaxial base layer having a bottom surface contacting said silicon substrate and a top surface opposite said bottom surface,
    a top region, relative to said transistor top and said transistor bottom, of said epitaxial base layer comprising a concentration of germanium having atomic compositions between 1% and 15% at said top surface, said concentration of germanium being sufficient to avoid impacting transistor parameters and sufficient to be resistant to selective chemical etching; and
    a silicon emitter layer of said first conductivity type overlying, relative to said transistor top and said transistor bottom, a portion of said epitaxial base layer adjacent said top surface of said epitaxial base layer.

2. The structure according to claim 1, further comprising:
    a trench surrounding said collector region; and
    an insulator within said trench.

3. The structure according to claim 1, said silicon emitter layer further comprising an emitter having sidewalls and sidewall spacers attached to said sidewalls of said emitter.

4. The structure according to claim 1, said base layer further comprising:
    a silicon layer overlying, relative to said transistor top and said transistor bottom, said top region of said base layer.

5. The structure according to claim 1, said epitaxial base layer comprising SiGe, and, said emitter layer and said silicon substrate comprising Si.

6. The structure according to claim 1, said concentration of germanium in said epitaxial base layer varying according to a predetermined profile between said top surface and said bottom surface, said predetermined profile being, in cross-section between said transistor top and said transistor bottom, one of:
    triangular shaped; and
    trapezoidal shaped.

7. A device having a device top and a device bottom, said device comprising:
    an n-type doped collector of a bipolar transistor disposed in an upper portion, relative to said device top and said device bottom, of a silicon (Si) substrate layer;
    a base comprising p-type doped epitaxial silicon germanium (SiGe) disposed on said Si substrate layer above, relative to said device top and said device bottom, said n-type doped collector, said base contacting said Si substrate layer,
    a top region of said base, relative to said device top and said device bottom, comprising a concentration of germanium (Ge) having atomic compositions between 1% and 15% at a top surface of said base, said concentration of germanium being sufficient to avoid impacting transistor parameters, and sufficient to be resistant to selective chemical etching; and
    an n-type doped silicon (Si) emitter contacting said base.

8. The device according to claim 7, further comprising:
    a trench surrounding said collector; and
    an insulator within said trench.

9. The device according to claim 7, said n-type doped Si emitter further comprising:
sidewalls and sidewall spacers attached to said sidewalls of said emitter.

10. The device according to claim 7, said base comprising an intrinsic base portion and an extrinsic base portion, said device further comprising:
silicide pads and electrical contacts connected to said emitter, said collector, and said extrinsic base portion.

11. The device according to claim 7, said base further comprising:
a silicon layer overlying, relative to said device top and said device bottom, said top region of said base.

12. The device according to claim 7, said concentration of germanium in said base varying according to a predetermined profile between said device top and said device bottom, said predetermined profile being, in cross-section between said device top and said device bottom, one of:
triangular shaped; and
trapezoidal shaped.

13. A bipolar transistor comprising:
a collector region of a first conductivity type within a semiconductor substrate;
a base of a second conductivity type contacting a portion of said collector region;
an etch-stop region in a surface layer of said base, said surface layer being located opposite said semiconductor substrate, said etch-stop region having atomic compositions of germanium between 1% and 15% at said surface layer, said atomic compositions of germanium being sufficient to avoid impacting transistor parameters and sufficient to be resistant to selective chemical etching; and
an emitter of said first conductivity type contacting said etch-stop region of said base.

14. The bipolar transistor according to claim 13, said base comprising:
a single crystal, epitaxially grown directly on said collector region.

15. The bipolar transistor according to claim 13, said emitter comprising:
a single crystal, epitaxially grown directly on said base.

16. The bipolar transistor according to claim 13, further comprising:
a trench surrounding said collector region; and
an insulator within said trench.

17. The bipolar transistor according to claim 13, further comprising:
sidewall spacers attached to sidewalls of said emitter.

18. The bipolar transistor according to claim 13, said base comprising an intrinsic base portion and an extrinsic base portion, said bipolar transistor further comprising:
silicide pads attached to each of said emitter, said collector, and said extrinsic base portion; and
electrical contacts connected to each of said silicide pads.

19. The bipolar transistor according to claim 13, said atomic compositions of germanium in said base varying according to a predetermined profile, said predetermined profile being, in cross-section, one of:
triangular shaped; and
trapezoidal shaped.

20. The bipolar transistor according to claim 13, said surface layer further comprising:
a silicon layer overlying said etch-stop region.

* * * * *